United States Patent [19]
Cho

[11] Patent Number: 5,185,766
[45] Date of Patent: Feb. 9, 1993

[54] APPARATUS AND METHOD FOR DECODING BIPHASE-CODED DATA

[75] Inventor: Sung-Won Cho, Seoul, Rep. of Korea

[73] Assignee: Samsung Electronics Co., Ltd., Kyungki, Japan

[21] Appl. No.: 513,678

[22] Filed: Apr. 24, 1990

[51] Int. Cl.$^5$ .................. H03D 3/22; H04L 27/10
[52] U.S. Cl. ............................... 375/87; 375/23; 375/55; 329/313
[58] Field of Search ............ 375/23, 55, 80, 82, 375/83, 87, 110, 22; 329/304, 310, 312, 313, 341, 342; 340/825.7, 825.58, 825.62; 360/42

[56] References Cited

U.S. PATENT DOCUMENTS

| | | | |
|---|---|---|---|
| 3,808,367 | 4/1974 | Wigner et al. | 375/55 |
| 4,309,673 | 1/1982 | Norberg et al. | 329/313 |
| 4,320,525 | 3/1982 | Woodward | 375/87 |
| 4,430,652 | 2/1984 | Rothenbuhler et al. | 375/23 |
| 4,567,604 | 1/1986 | Jacksier | 375/87 |
| 4,578,799 | 3/1986 | Scholl et al. | 375/87 |
| 4,583,211 | 4/1986 | Nishikawa et al. | 329/312 |
| 4,809,301 | 2/1989 | Rhodes | 375/87 |
| 5,001,728 | 3/1991 | Fuldner | 375/83 |

Primary Examiner—Curtis Kuntz
Assistant Examiner—Young T. Tse
Attorney, Agent, or Firm—Robert E. Bushnell

[57] ABSTRACT

There is provided a system for decoding a digital code and in particular a biphase-coded data, by detecting edges of the biphase-coded data and the time intervals between edge conditions. A system for decoding the biphase-code data includes a microcomputer 1 to control the system, a remote receiver module (RRM) 2 for logicizing code data received in infrared rays, filtering the waveform, and applying the output to the microcomputer 1; a first remote transmitter (RTTP) 5 for generating Pulse Position Modulation (PPM) code; a second remote transmitter (RTTB) 7 for generating biphase-code according to the pressing of a key; a tuner 9, display unit 11, and servo 13 operated under the control of the microcomputer 1; and a key matrix 15 for entering key data to the microcomputer 1.

20 Claims, 4 Drawing Sheets

APPARATUS AND METHOD FOR DECODING BIPHASE-CODED DATA

BACKGROUND OF THE INVENTION

This invention generally relates to the decoding of digital codes and, in particular, to means for receiving and decoding biphase-coded data.

Generally, the so-called biphase encoding technique is a kind of digital encoding method and is currently used very widely as a data modulation method. As a modulation method identical to biphase-code, there is also the Manchester code, which is referred to as a biphase-L method.

Biphase-codes are widely used in the digital communication area and are used as a remote code for European TV's or for electric home appliances.

In a known method for receiving biphase-code by use of a remote receiver and for decoding it, i.e. recognizing the received code using a microcomputer, the decoding method for reconstructing the original data is effected by performing periodic timing checks and by checking the edge status change of the biphase-code.

However, such a decoding method for detecting the edge condition of a biphase-code at every time interval requires exact timing information to be able to detect the code.

Moreover, the difficulty of timing synchronization raises the cost so that systems become high priced and inexact timing is apt to cause inaccurate reading of data. Therefore, it tends to be that the less error margin a system has, the higher the price is.

SUMMARY OF THE INVENTION

The present invention aims to provide a generally improved apparatus for decoding biphase-code data.

According to a first aspect of the present invention, there is provided apparatus for receiving and decoding biphase-coded data, comprising:

a receiver for receiving a bit stream of biphase-coded data;

a microprocessor for detecting edges of the pulses forming the bit stream received by the receiver;

for determining the time periods between said edges; and for decoding the sequence of bits in the bit stream, from said determined time periods.

In a preferred embodiment, the detector of the microprocessor is arranged to detect edges which are either all falling edges or all rising edges.

Preferably, the apparatus is arranged to receive and decode data in which the period of a bit is 2t and is adapted to discriminate between time periods of 2t, 3t and 4t, to identify different sequences of bits in the bit stream.

Preferably, said microprocessor is arranged to decode said sequence of bits from not only said time periods but also from the logical value of the last detected bit.

Preferably, the apparatus includes a register arranged to be incremented by the number of bits decoded, and means for testing whether the count of said register is equal to an expected number of bits in said bit stream.

The apparatus is preferably arranged to receive and decode data encoded in a vesta code.

The apparatus is preferably arranged to receive and decode data in which at least one leading bit of said bit stream has a predetermined logical value.

The apparatus may comprise a microcomputer for controlling operation of the apparatus; a remote receiver for receiving remotely transmitted coded data and transmitting the data to the microcomputer; at least one remote transmitter for remotely transmitting said coded data to the remote receiver in accordance with key information entered at the transmitter by a user; and at least one peripheral device arranged to be controlled by the microcomputer in accordance with said coded data.

The invention also extends to television or video apparatus which includes apparatus in accordance with the first aspect of the invention for receiving and decoding biphase-coded data.

In a second aspect, the invention provides a method of decoding a bit stream of biphase-coded data, comprising the steps of detecting edges of pulses forming the bit stream, determining the time periods between said edges, and decoding the sequence of bits in the bit stream, from said time periods.

Such a method may further comprise one or more of the steps or features disclosed in this specification and/or claims and/or abstract and/or accompanying drawings.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF AN EXEMPLARY EMBODIMENT

Figure 1:
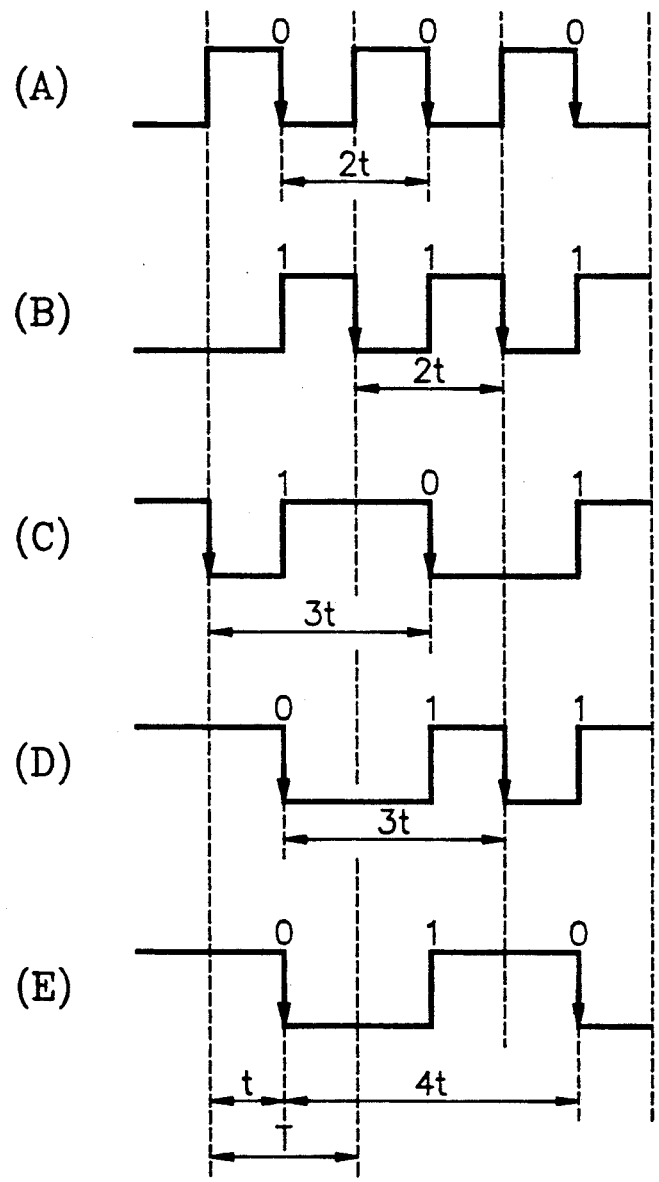
FIG. 1 is a general illustration of biphase-code data structure.

Referring to FIG. 1, there is shown a general biphase-code data structure. According to this illustration, each waveform A, B, C, D, and E illustrates a different respective stream of bits which are represented by logic "0" and "1" in biphase-coded logic.

If the period of a bit is assumed to be T, the waveforms A-E each have a change of coding logic transition at the time T/2 (T/2=t). For example, if the logic of a bit is "0", its coding logic will change from logic "HIGH" to "LOW" at time t, and if the logic of a bit is "1", its coding logic will change from logic "LOW" to "HIGH" at time t.

The illustrated system detects the falling edges of a biphase-coded bit stream in which the logic of the bits may change as shown in the waveforms A-E of FIG. 1, and decodes the biphase-code by detecting the falling edges and measuring the time intervals between the falling edges.

For the waveforms of FIG. 1, if a bit period is assumed to be the period T, there will be two t's (t=T/2) in one bit period. Therefore, for the biphase-code, there exist no consecutive two bits which do not have the structure of one of the waveforms A-E shown in FIG. 1.

In the illustrated system, since the code is decoded by detecting successive edges of prescribed condition and the time intervals between the edges of the prescribed condition, there exists no accurate data except the data for the intervals 2t, 3t, and 4t as shown in FIG. 1. The time intervals 2t, 3t and 4t represent the only possible sequences of two or three bits in the biphase-coded bit stream. The time interval 4t represents only one possibility—the sequence "010". The time interval 3t may represent the sequence "01" or "10", and the time interval 2t may represent the sequence "00" or "11".

Figure 2:
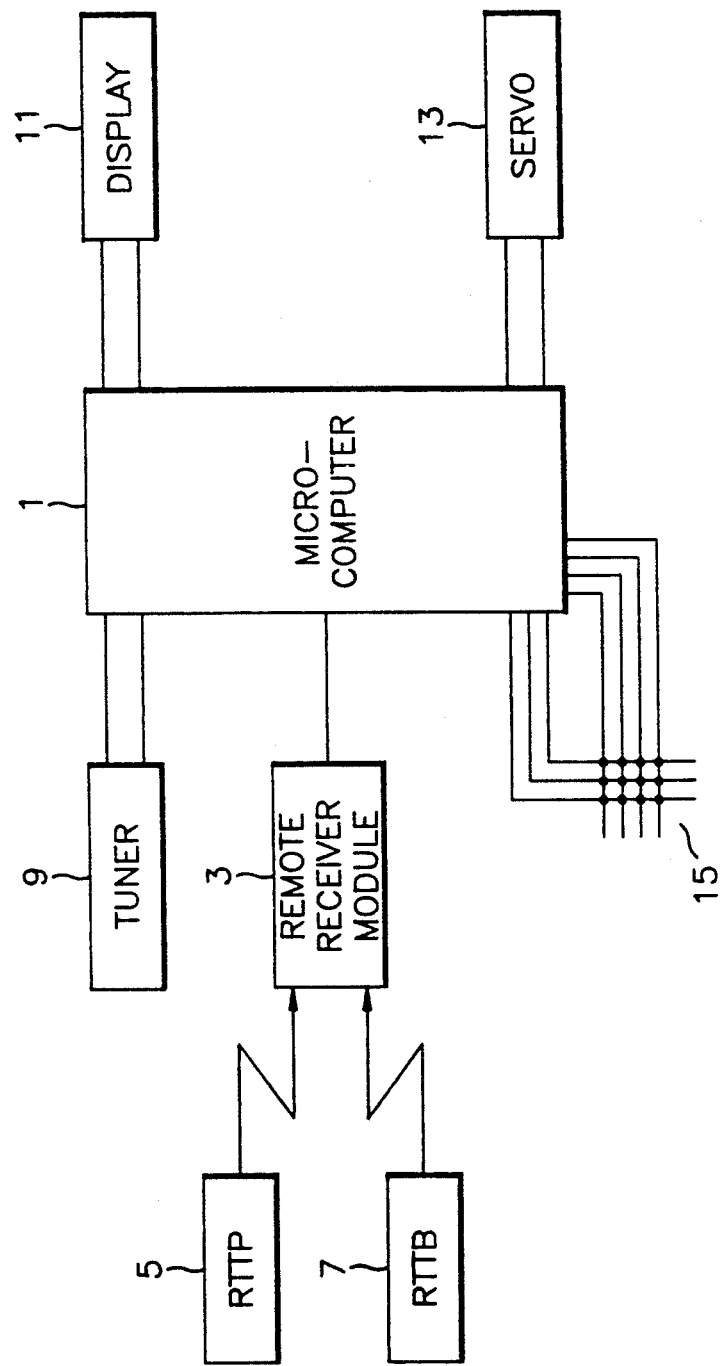
FIG. 2 is a block diagram of one example of a system embodying the invention, for carrying out decoding of biphase-coded data.

Referring to FIG. 2, the system comprises a microcomputer 1. A remote receiver module (hereinafter referred to as RRM) 3 which logicizes code data received as infrared rays, filters the waveform, and applies the output to the microcomputer 1. Arranged to transmit to the RRM 3, a first remote transmitter 5 (hereinafter referred to as RTTP) generates a Pulse Position Modulation (PPM) code. Also arranged to transmit to the RRM 3, a second remote transmitter 7 (hereinafter referred to as RTTB) generates biphase-code according to the pressing of one or more keys. Meanwhile, a tuner 9, display unit 11, and servo 13 are operated under the control of the microcomputer 1. Additionally, a key matrix 15 is used to enter key data to the microcomputer 1.

Prior to explaining an operational example of the illustrated system, a vesta code format which is used in European TV sets and in remote controllers for VCRs will be described first, with reference to FIG. 3.

Figure 3:
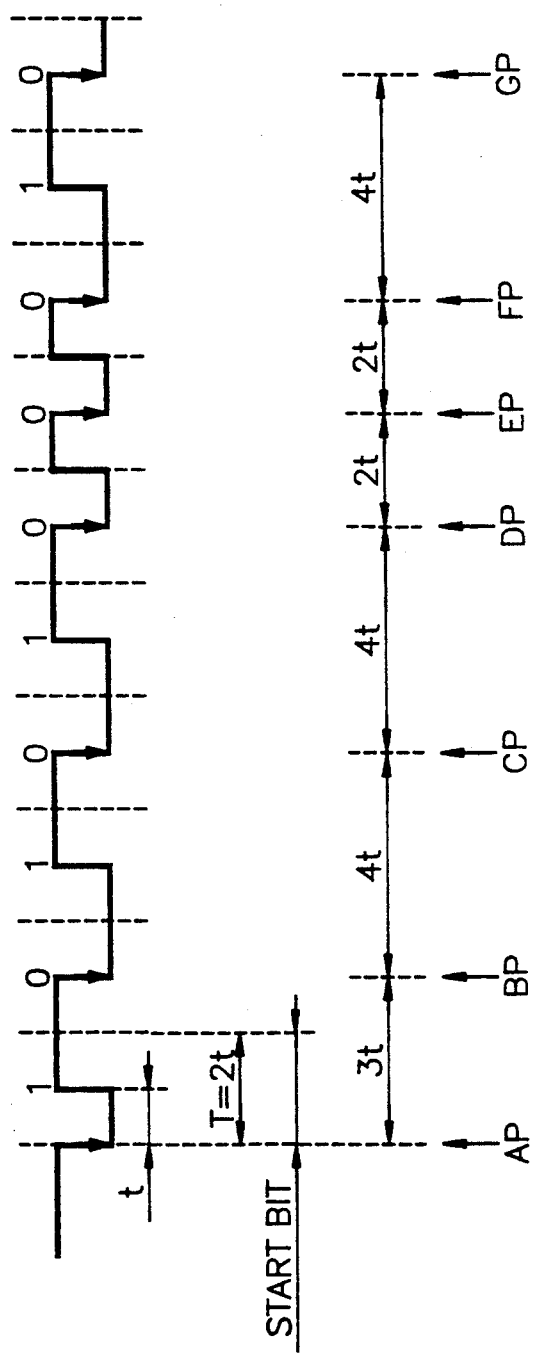
FIG. 3 illustrates one example of a biphase-code data format used in the example of FIG. 2.

Vesta code is constructed as a biphase-code and, as shown in FIG. 3, the first bit is the start bit. Such a bit always has the logic value "1" and is a code leading the input of the next in-coming code data.

If a key of RTTB 7 in FIG. 2 is pressed and a signal for performing a prescribed control is generated as an infrared signal comprising a bit stream having the data structure of FIG. 3, then this signal is received at RRM 3 and filtered, and then is applied to the interrupt port of the microcomputer 1, which is used for detecting the falling edges of the pulses of the bit stream.

In this case, the vesta code, i.e. the biphase-code which is applied to the falling edge interrupt port of said microcomputer 1, exists only with the previous mentioned time intervals of FIG. 1 because of the inherent characteristics of the biphase-code. If other time intervals are detected, this indicates an erroneous case. Moreover, as mentioned, for the format of vesta code, the first bit is the start bit and always has the condition of logic "1".

Figure 4:
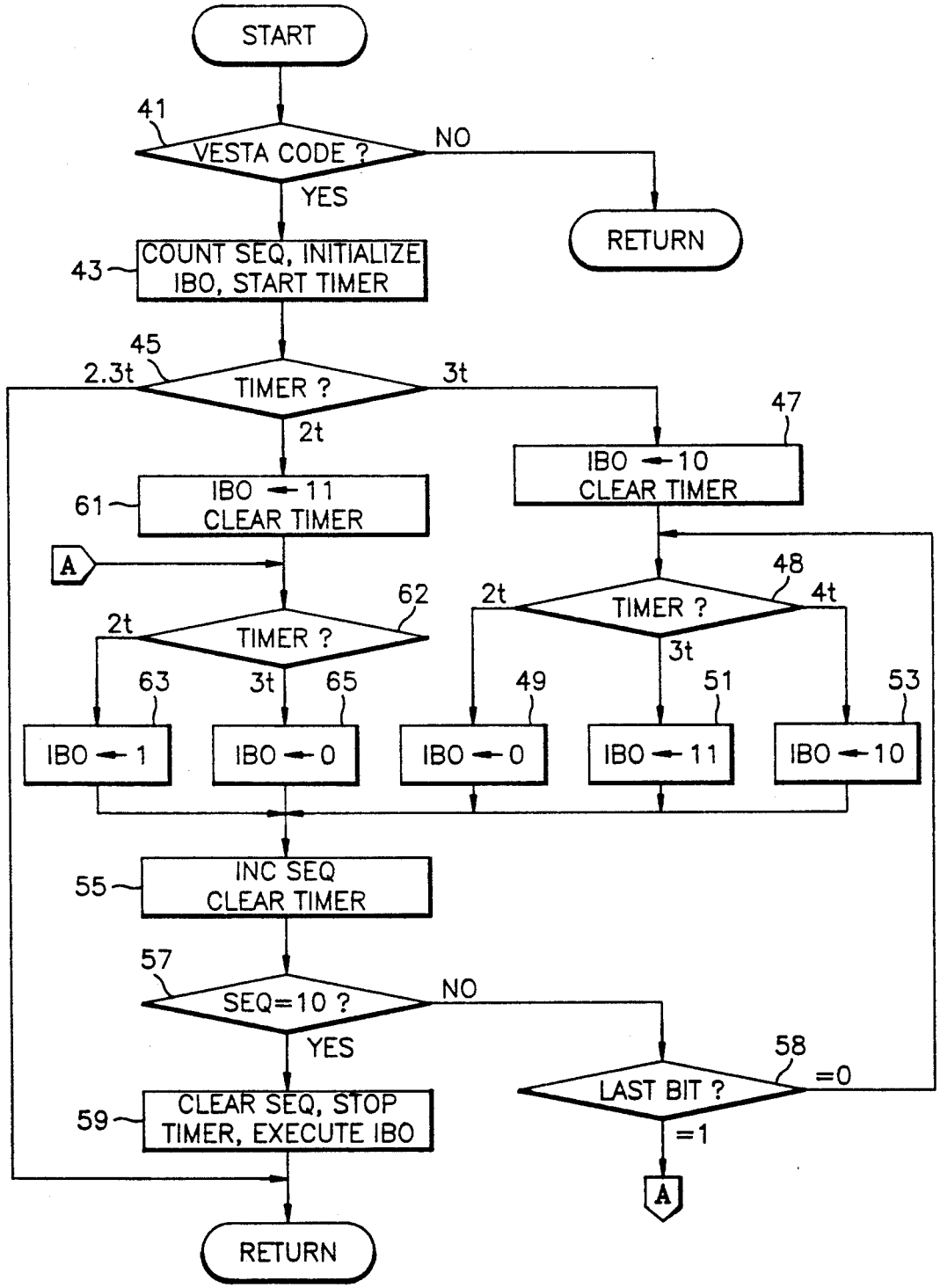
FIG. 4 is a flow diagram for showing an example of the operation of the system of FIG. 2.

The microcomputer 1, which receives the biphase-code of FIG. 3 at the falling edge interrupt port, firstly checks at step 41 of FIG. 4, whether the input code is a valid vesta code.

The microcomputer 1 thus checks for abnormal condition using the start bit of FIG. 3 and, if the code is proved to be a vesta code, the microcomputer 1 sets an internal sequence register SEQ to counter mode at step 43 and initializes it to count decimal 2, initializes a data register IBO which stores data temporarily, and starts an internal timer TIM. At this time, the starting pointer of the internal timer TIM starts to operate when the signal AP of FIG. 3 is applied.

In step 45, upon detecting the falling edge signal BP as shown in FIG. 3, the microcomputer 1 checks the value of the timer. Since the start bit of the vesta code is always "1", the value of the timer at step 45 can have either of the values 2t or 3t, depending upon whether the first two bits of the bit stream are "11" or "10" respectively—as illustrated in FIGS. 1B) or 1C) respectively.

In the example of FIG. 3, the first two bits of the vesta code are "10". Accordingly, in step 45, the value of the timer is found to be 3t, and therefore the microcomputer 1 proceeds to step 47.

At step 47, the microcomputer 1 saves the bit values "10" into the internal data register IBO, and clears the timer, which starts counting again.

Next, at step 48, the microcomputer 1 again checks the value of the timer, upon detecting the next falling edge signal which, in the example of FIG. 3, is the signal CP. In the general case, the timer can have any one of the values 2t, 3t or 4t. This is because the last preceding bit is "0" (this being the last bit of the first two bits "10" of the vesta code) and, referring to FIGS. 1A), 1D), and 1E) respectively, it may be seen that, with an initial bit value of "0", the bits sequences "00", "011" and "010" respectively are possible, in dependence upon whether the measured time interval between successive falling edge signals is 2t, 3t or 4t respectively.

In the example of FIG. 3, the second to fourth bits of the code have the sequence "010" and, accordingly, the measured time interval between the falling edge signals BP and CP is 4t. Thus, the microcomputer 1 proceeds to step 53, whereupon the bit sequence "10" is added to the internal data register IBO.

At this point, it should be noted that, although the detected time interval of 4t indicates a bit sequence of "010", it is necessary to save only the last two bits of this sequence into the register IBO in step 53, since the leading "0" has already been saved into the register IBO as the last bit, in step 47.

The internal sequence register SEQ maintains a count of the number of bits of the vesta code that have been recorded in the data register IBO. In step 43, the count was initialized to decimal 2, because in both steps 47 and 61, the data register IBO will record a first sequence of two bits—that is, either "10" (step 47) or "11" (step 61). Then, after step 53, the sequence register SEQ is incremented by the number of additional bits read into the data register IBO, which in this case, is two extra bits. Thus, at this point, the count of the sequence register SEQ is decimal 4.

At step 57, the microcomputer 1 checks whether the count of the sequence register SEQ is equal to decimal 10. Since, in the present example, the count is only decimal 4 at this stage, the microcomputer 1 proceeds to step 58, which tests whether the last bit recorded in the data register IBO is "0" or "1".

In the present example, the last recorded bit was "0", and therefore the microcomputer 1 returns to execute again step 48, where the value of the timer is again checked upon detecting the next falling edge signal.

To proceed with the example of FIG. 3, the next falling edge signal DP is detected after another time interval of 4t, corresponding to another bit sequence of "010". Accordingly, the microcomputer 1 again proceeds to step 53, where the next two bits "10" are read into the data register IBO. Subsequently, in step 55, the sequence register SEQ is incremented by a count of 2, to give a total count of 6, and the timer is again cleared, and recommences counting.

In step 57, the count of the sequence register SEQ is again checked to see if it is equal to decimal 10. The present count of the example of FIG. 3 is decimal 6, representing the six bits that have already been recorded in the data register IBO. Therefore, the microcomputer 1 proceeds again to step 58, to check the value of the last recorded bit.

Once more, the last recorded bit has the value "0", and therefore the microcomputer 1 again returns to step 48, where the value of the timer at the next detected falling edge signal BP is checked.

The time interval between the two falling edge signals DP and EP is 2t, and this corresponds to a bit sequence "00". Accordingly, the microcomputer 1 proceeds from step 48 to step 49, where the additional single bit "0" is recorded in the data register IBO.

Thereafter, the step 55 is executed, to increase the sequence register(s), this time by a count of just one, to indicate a recorded total of seven bits. Again, the timer is cleared and restarted.

At step 57, the count of the sequence register SEQ is still not equal to decimal 10. Thus, the step 58 is repeated and, since the last recorded bit is again "0", step 48 is once more executed.

In the example of FIG. 3, the next falling edge signal FP occurs at a time interval 2t after the preceding signal EP, again corresponding a bit sequence "00". Accordingly, the steps 49, 55, 57 and 58 are again executed, during which the count of the sequence register SEQ is incremented to a total of eight, and after which the step 48 is once more executed.

In the example of FIG. 3, the final falling edge signal GP occurs at a time interval 4t after the preceding signal FP, corresponding to a final bit sequence "010". Thus, steps 53, 55 and 57 are again executed.

Upon this occasion, the sequence register SEQ is incremented by another two bits, to bring the total count up to decimal 10. Thus, in step 57, the test gives an affirmative result, such that the microcomputer 1 proceeds to step 59.

Since, in this particular example, the illustrated vesta code has a total of ten bits in its bit stream, the positive result to step 57 indicates that a complete bit stream has been received, and the value of the bit stream, namely the data "1010100010" has been stored in the data register IBO.

Thus, in step 59, the sequence register SEQ is cleared and the timer TIM is stopped. The content of the data register IBO is read out by the microcomputer 1, which then performs the function—for example, by controlling the tuner 9, display 11 and/or servo 13, in accordance with the instruction to which the bit stream read from the data register IBO corresponds.

In the example of FIG. 3, the second bit was "0", and each "last bit" recorded in the data register IBO was always "0". However, a bit stream of the type shown in FIG. 3 may of course have a different sequence of bits (and, in the more general case, may have a different number of bits).

If the second bit in the ten-bit pulse train is a logic "1" then, as illustrated in FIG. 1B), the time interval between the first two falling edges will be 2t. Accordingly, the microcomputer 1 will proceed from step 45 to step 61, where the initial two bits "11" are stored into the data register IBO. As in the previously described example, the initial value of the sequence register SEQ is, at this stage, already set to decimal 2.

The timer is cleared and restarted in step 61, and then, in step 62, the value of the timer at the next falling edge signal is again checked. Since, in this case, the last recorded bit was "1", the only possible values for the timer will now be 2t or 3t, depending upon whether the bit sequence is "11" or "10", as illustrated in FIGS. 1B) and 1C) respectively.

If step 62 reveals a timer value of 2t, then the data bit "1" is entered into the data register in step 63, and the steps 55 and 57 are carried out, as before.

If, in the present alternative example, an initial bit stream of "111" has been recorded then, at step 55, the count of the sequence register SEQ will be decimal 3 so that, after step 57, the microcomputer 1 proceeds to step 58.

Following this same example, the last recorded bit was "1", so that the microcomputer 1 proceeds from step 58 to repeat step 62.

This time, if the timer test in step 62 results in a value 3t, then this indicates a bit sequence of "10". Step 65 is therefore executed, to store the fourth bit "0" into the data register IBO.

The steps 55, 57 and 58 are again executed, during which the count of the sequence register SEQ is incremented to decimal 4. Since, in this instance, the last recorded bit was a "0", then the microcomputer 1 will proceed from step 58 to step 48.

If, for the sake of example, the next measured timer interval is 3 t then, as illustrated in FIG. 1D), this will indicate a bit sequence of "011", and steps 51, 55, 57 and 58 will be executed, during which the count of the sequence register SEQ will be incremented to decimal 6.

Since the last recorded bit is again "1", the microcomputer 1 will proceed from step 58 to step 62.

Thereafter, the procedure repeats along the lines illustrated in the above described examples, until the count of the sequence register SEQ agains becomes decimal 10, at which point step 59 will be performed and the control function indicated by the detected vesta code will be performed, under the control of the microcomputer 1.

Since the above described system can recognize a biphase-code by a simple means and can be applied to all systems which use Pulse Position Modulation (PPM) and vesta code, the advantages of implementing an improved value-added product conveniently and of implementing a hybrid remote control system are obtained.

A particular advantage of the embodiments illustrated and/or described above is that they may continue to operate reliably, even if the timing of the received waveform is subject to variation. For example, the system may operate accurately, even if the timing of the falling edges is subject to variations of about ±10% of the period T of one bit.

While preferred embodiments of the invention have been particularly shown and described, it will be understood by those skilled in the art that modifications may be made without departing from the spirit and scope of the invention.

Although the illustrated vesta code illustrates a ten-bit bit stream with a logic "1" start bit, alternative codes with different numbers of bits and different start bits may be decoded by suitably modified but analogous systems and methods. Similarly, where logic values and systems are described and illustrated herein, complementary values and systems may alternatively be adopted. Rising edges of pulses may be detected, instead of or in addition to falling edges.

The reader's attention is directed to all papers and documents which are filed concurrently with or previous to this specification and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

I claim:

1. Apparatus for receiving and decoding biphase-code data, comprising:
   first means for receiving a bit stream of biphase-coded data;
   second means for detecting edges of pulses forming the bit stream received by said first means;
   third means for determining time periods between said detected edges; and
   fourth means for decoding and determining a logical value for each bit in the bit stream, based on the value of said time periods determined by said third means in combination with the logical value of an immediately preceding bit.

2. Apparatus according to claim 1, wherein said second means is arranged to exclusively detect either all falling edges or all rising edges.

3. Apparatus according to claim 1, wherein said bit stream of biphase-coded data comprises:
   multibit data in which the time period of each bit is 2t and wherein said third means is adapted to discriminate between time periods of 2t, 3t and 4t, and to assign binary values to said time periods according to said discrimination, where t is a desired time period.

4. Apparatus according to claim 1, further comprising;
   a register arranged to be incremented by each bit decoded by said fourth means, and
   means for testing whether the count of said register is equal to an expected number of bits in said bit stream.

5. Apparatus according to claim 1, wherein said bit stream of biphase-coded data comprises:
   biphase-coded data encoded in a "vesta" code format.

6. Apparatus according to claim 1, wherein at least one leading bit of said bit stream has a predetermined logical value.

7. Apparatus according to claim 6, wherein said predetermined logical value is a logic high value.

8. Apparatus according to claim 7, wherein said second means is arranged to exclusively detect either all falling edges or all rising edges.

9. Apparatus according to claim 7, wherein said bit stream of biphase-coded data comprises:
   multibit data in which the time period of each bit is 2t and wherein said third means is adapted to discriminate between time periods of 2t, 3t and 4t, and to assign binary values to said time periods according to said discrimination, where t is a desired time period.

10. Apparatus according to claim 7, further comprising;
    a register arranged to be incremented by each bit decoded by said fourth means, and
    means for testing whether the count of said register is equal to an expected number of bits in said bit stream.

11. Apparatus according to claim 7, wherein said bit stream of biphase-coded data comprises:
    biphase-coded data encoded in a "vesta" code format.

12. Apparatus according to claim 7, wherein said second means is configured for detection of data phase shifts from high state to low state.

13. Apparatus according to claim 7, wherein said second means is configured for detection of data phase shifts from low state to high state.

14. Apparatus according to claim 7, further comprising:
    means for controlling television and/or video apparatus according to said decoded sequence of bits.

15. Apparatus according to claim 1, further comprising:
    means for controlling television and/or video apparatus according to said decoded sequence of bits.

16. Apparatus according to claim 1, wherein said second means is configured for detection of data phase shifts from high state to low state.

17. Apparatus according to claim 1, wherein said second means is configured for detection of data phase shifts from low state to high state.

18. A method of decoding a bit stream of biphase-coded data, comprising of the steps of:
    detecting edges of pulses forming the bit stream,
    determining the time periods between said edges, and
    decoding and determining a logical value for each bit in the bit stream, based on a combination of said determined time periods and the logical value of an immediately preceding bit.

19. An apparatus for receiving and decoding biphase-code data, comprising:
    first means for receiving a bit stream of biphase-coded data;
    second means for detecting edges of pulses forming the bit stream received by said first means;
    third means for determining time periods between said detected edges; and
    fourth means for decoding the sequence of bits in the bit stream, based on the value of said time periods determined by said third means;
    wherein said bit stream of biphase-coded data comprises:
    multibit data in which the time period of each bit is 2t and wherein said third means is adapted to discriminate between time periods of 2t, 3t and 4t, and to assign logic values to said time periods according to said discrimination, where t is a desired time period.

20. The apparatus according to claim 19, wherein said second means is arranged to exclusively detect either all falling edges or all rising edges.

* * * * *

UNITED STATES PATENT AND TRADEMARK OFFICE
CERTIFICATE OF CORRECTION

PATENT NO. : 5,185,766

DATED : 9 February 1993

INVENTOR(S) : Sung Won Cho

It is certified that error appears in the above-identified patent and that said Letters Patent is hereby corrected as shown below:

On the title page, item [73],

Change "Japan" to --Korea--.

Signed and Sealed this

Second Day of November, 1993

Attest:

BRUCE LEHMAN

Attesting Officer     Commissioner of Patents and Trademarks